United States Patent [19]
Colby

[11] Patent Number: 5,982,132
[45] Date of Patent: Nov. 9, 1999

[54] ROTARY WAFER POSITIONING SYSTEM AND METHOD

[75] Inventor: Paul C. Colby, Sunnyvale, Calif.

[73] Assignee: Electroglas, Inc., Santa Clara, Calif.

[21] Appl. No.: 08/947,768

[22] Filed: Oct. 9, 1997

[51] Int. Cl.⁶ .............................. H01L 21/68; B23Q 3/18
[52] U.S. Cl. ...................... 318/649; 414/935; 74/490.08; 74/490.1; 269/71
[58] Field of Search ................................. 318/648, 649, 318/560; 33/1 M; 74/471 XY, 490.07, 490.08, 490.1; 269/71, 73; 901/16; 414/935, 940

[56] References Cited

U.S. PATENT DOCUMENTS

| | | | |
|---|---|---|---|
| 4,455,512 | 6/1984 | Cornwell et al. | 318/135 |
| 4,717,829 | 1/1988 | Turner | 250/492.2 |
| 4,836,733 | 6/1989 | Hertel et al. | 414/225 |
| 4,881,863 | 11/1989 | Braginsky | 414/225 |
| 5,052,884 | 10/1991 | Igari | 414/774.2 |
| 5,194,743 | 3/1993 | Aoyama et al. | 250/548 |
| 5,295,777 | 3/1994 | Hodos | 414/217 |
| 5,374,888 | 12/1994 | Karasawa | 324/765 |
| 5,670,888 | 9/1997 | Cheng | 324/754 |
| 5,740,034 | 4/1998 | Saeki | 414/331 X |
| 5,753,923 | 5/1998 | Mera et al. | 250/443.1 |
| 5,796,486 | 8/1998 | Jacob | 414/936 X |

*Primary Examiner*—Bentsu Ro
*Attorney, Agent, or Firm*—Blakely, Sokoloff, Taylor & Zafman

[57] ABSTRACT

A method and apparatus for positioning rectilinearly a wafer holding platform by performing rotations in a positioning system. A method comprises coupling a first clamp to a wafer holding platform, decoupling a second clamp from the wafer holding platform, and rotating the first clamp to cause the wafer holding platform to be moved to a first position. Further couplings, decouplings, and rotations may be performed to achieve a rectilinear translation to a final position without a resultant rotation after the rectilinear translation. An apparatus of the invention comprises a first clamp having a first axis of rotation, a second clamp having a second axis of rotation, where the first axis and the second axis are not concentric. A wafer holding platform is independently couplable to the first clamp and to the second clamp and has a plurality of points on the wafer holding platform which are positionable at a plurality of X,Y locations by rotating independently the first and second clamps.

48 Claims, 7 Drawing Sheets

ROTARY WAFER POSITIONING SYSTEM AND METHOD

BACKGROUND OF THE INVENTION

1. Field of the Invention

The present invention relates generally to positioning systems and methods, and more particularly to positioning systems which control the movement of and therefore position a substrate such as a semiconductor wafer which includes many integrated circuits arranged on the substrate.

2. Background of the Invention

Positioning systems are used in various aspects of semiconductor fabrication. For example, photolithographic systems and wafer probers and other semiconductor integrated circuit fabrication tools often use a wafer positioning system. Most wafer positioning or manipulator stages are based on combinations of linear motions along orthogonal directions. An example of a conventional linear motion system in a wafer prober will now be described by referring to FIGS. 1 and 2.

Figure 1:
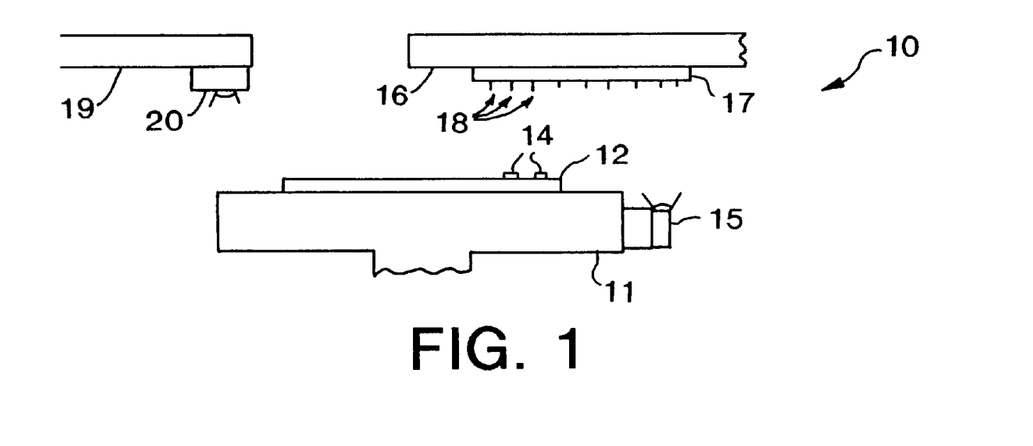
FIG. 1 shows a side view of a wafer probing system.

A semiconductor wafer normally includes many integrated circuits which are formed in a lattice of devices or integrated circuits. On each integrated circuit, there are a plurality of bonding pads which are used to connect the integrated circuit to external circuitry in order to allow the integrated circuit (IC) to function. Since the packaging of each IC is somewhat expensive, it is desirable to test each IC before packaging to avoid packaging defective IC's. This process of testing devices before packaging is referred to as the sort process. This process involves connecting a device referred to as a probe card to a special tester. FIG. 1 shows an example of a wafer prober system 10 which includes a generalized example of a probe card 17 which is mounted on the support 16. The probe card 17 includes a collection of pins 18 which stand in for the normal pins and wire leads of a package device. These pins 18 are made to come into electrical contact with the bonding pads 14 of at least one integrated circuit on the semiconductor wafer 12. The semiconductor wafer 12 rests on a wafer chuck 11, which may be referred to as a wafer holding platform. The wafer prober system 10 positions each IC on the wafer with respect to the probe card so that the appropriate pins 18 on the probe card contact the appropriate pads 14 for a particular IC on the wafer 12.

As the state of the semiconductor processing art progresses, wafers get larger, die geometries get smaller, the number of pads on each die increase, and the size of each pad decreases. Hence the alignment accuracy and speed requirements for a wafer prober become more stringent. These stringent requirements place great demands on the manipulator or positioning stages used in a wafer prober. These positioning stages or systems work in conjunction with modern vision systems which utilize cameras, such as cameras 15 and 20 which are designed to view the probe card and the wafer, respectively, in order to attempt to accurately align an IC on a wafer with respect to the contact pins on a probe card.

Figure 2:
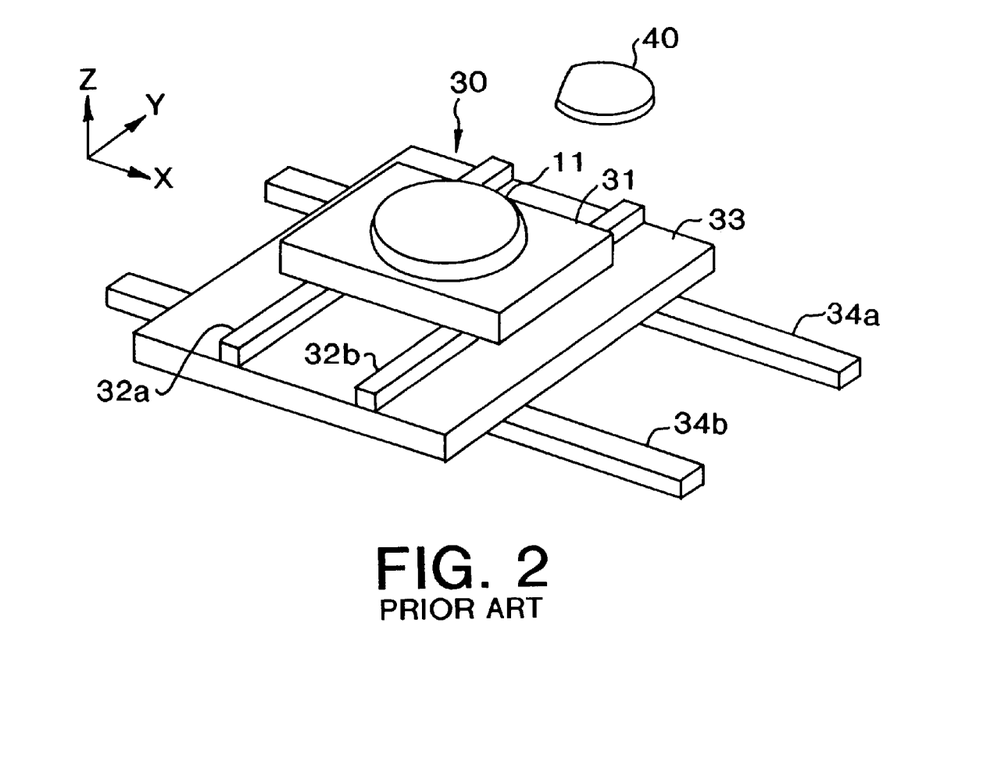
FIG. 2 shows a prospective view of a prior art wafer positioning system.

FIG. 2 shows an example of a conventional wafer positioning system which may be used in a wafer prober or other semiconductor fabrication tool. It will be appreciated that another conventional wafer positioning system may use a Sawyer motor stage; see for example, U.S. Pat. No. 4,455,512. For wafer probers, these positioning systems must provide four axes (X,Y,Z,θ) of motion. The usual implementation includes an X,Y stage for positioning in X,Y and an independent Z stage and an independent θ stage. FIG. 2 shows a wafer positioning system 30 which utilizes a conventional rectilinear X,Y stage. A wafer chuck 11 is positioned on top of the Y motion stage 31 which rides along the guide rails 32a and 32b to provide translation in the Y direction. The wafer chuck 11 may include a rotary motor positioned on top of the Y motion stage 31 and below the chuck 11 in order to provide θ motion for the wafer chuck 11. The X motion stage 33 rides along guide rails 34b and 34a in order to provide translation along X. The wafer 40 is positioned on top of the wafer chuck 11 and is typically held in place on top of the chuck by a vacuum generated under the surface of the wafer by the chuck. A separate Z stage provides movement up and down in Z by either increasing the distance between the wafer chuck 11 and the Y stage 31 or by moving the entire X and Y stages 31 and 33 (with their associated guide rails) up and down in the Z direction.

Wafer positioning stages which are based upon combinations of linear motions along orthogonal directions, such as wafer positioning system 30, are expensive and difficult to manufacture when very precise positioning resolution is required. As geometries on an integrated circuit decrease, positioning resolution must also improve to the point that a positioning resolution of a few microns is often required. Hence, it is desirable to provide a wafer positioning system which is inexpensive to manufacture and also provides high positioning resolution.

SUMMARY OF THE INVENTION

The present invention provides a method for positioning a wafer holding platform. In one example of this method, a first clamp is coupled to the wafer holding platform and a second clamp is decoupled from the wafer holding platform. The first clamp is rotated to cause the wafer holding platform to be moved to a first position while the second clamp remains decoupled from the wafer holding platform. In one example of the present invention, the method further includes the steps of coupling the second clamp to the wafer holding platform while decoupling the first clamp from the wafer holding platform and then rotating the second clamp to cause the wafer holding platform to be moved to a second position. In a further example of a method according to the present invention, the method further includes the steps of coupling again the first clamp to the wafer holding platform while decoupling the second clamp from the wafer holding platform and rotating again the first clamp to cause the wafer holding platform to be moved to a third position.

In one example of a method of the present invention, a point on the wafer holding platform is moved from an original position to the first position and then to the second position and then to the third position such that the point is moved in an X,Y coordinate system without a resultant rotation of the wafer holding platform after the point is moved to the third position.

The present invention also provides a wafer positioning system which includes in one embodiment a first clamp which has a first axis of rotation, a second clamp which has a second axis of rotation, and a wafer holding platform which is independently couplable to the first clamp and to the second clamp. The first axis and the second axis are non-concentric. The wafer holding platform is positionable at a plurality of X,Y locations by rotating independently the first clamp and the second clamp. Typically, at least one motor is coupled to one of the first clamp and the second clamp to provide rotary motion of the clamps.

According to another aspect of the present invention, a computer system with a computer readable storage medium provides the controls for the wafer positioning system in order to perform various methods of the present invention. In this way, the rotational movements required in order to perform X,Y translations may be automatically controlled in a wafer positioning system.

Various other aspects and features of the present invention will become apparent upon review of the following description.

BRIEF DESCRIPTION OF THE DRAWINGS

The various embodiments of the present invention will be described in detail with reference to the following drawings in which like reference numerals refer to like elements.

DETAILED DESCRIPTION

The following description provides examples of the present invention. It will be appreciated, however, that other examples of the present invention will become apparent to those in the art upon examination of this description. Thus, the present description and the accompanying drawings are for purposes of illustration and are not to be used to construe the invention in a restrictive manner.

Most wafer positioning stages are based upon combinations of linear motions along orthogonal directions. It has long been known, however, that translations in a plane may be constructed from combinations of rotations about non-concentric centers. For applications which require accurate location only at the end points of travel, a rotary stage based on rotary motion, rather that rectilinear translation motion, may have many practical advantages. For a wafer prober which performs wafer probing, the advantages include simplicity, robustness, and reduced cost. These advantages are derived in two ways. The first way is that a rotary stage may be constructed from commonly available technology which is available from many sources currently. A rotary stage for supporting a large wafer and providing a positioning resolution of 3 microns is achievable using readily available bearings, servo motors, angle encoders, and controllers. Such a large wafer may be as large as approximately 300 millimeters or larger. The second way in which these advantages are derived is from configuration changes which are made possible by the use of a rotary wafer positioning stage. For example, it is possible to obtain closed loop wafer motion, wherein feedback from a vision system during the motion assists in controlling the proper movement of the wafer platform.

Figure 3A:
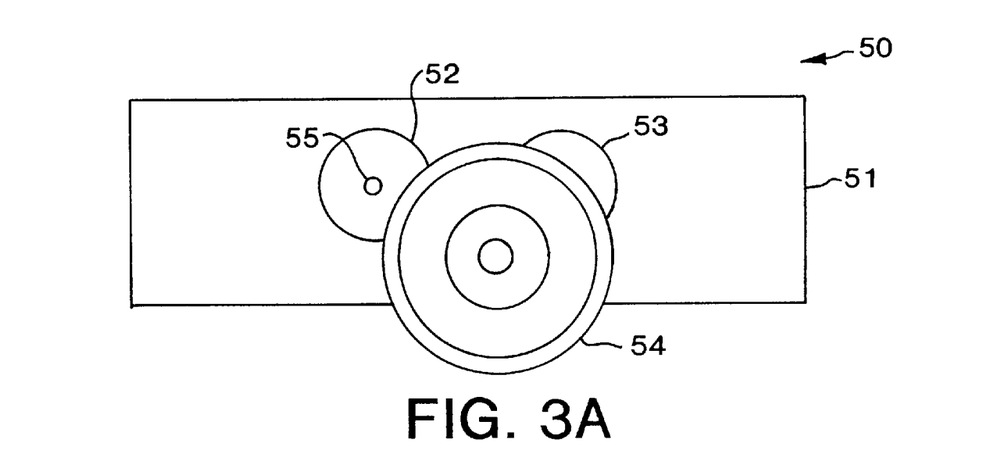
FIG. 3A shows a top view of a wafer positioning system of the present invention.

FIG. 3A shows a wafer positioning system 50 according to one embodiment of the invention. A housing structure 51 supports two clamps 52 and 53 each of which are independently couplable to the wafer holding platform or wafer chuck 54. Each clamp includes a spindle which defines the axis of rotation for the clamp. In the example shown in FIG. 3A, the spindle 55 can be seen from the top view provided by this figure. The wafer chuck 54 is typically equipped with vacuum rings to hold the wafer. The bottom of the wafer chuck 54 is a magnetically soft material. The clamps 52 and 53 include electromagnets which receive power through the respective shaft or spindle of the clamp. This power is controlled by a clamp control circuit which operates according to a method of the present invention as described below. When the electromagnets within a clamp are energized, the wafer holding platform 54 is constrained by the magnetic force normal to the surface of the clamp. Lateral constraint of the wafer holding platform is achieved through the frictional force between the clamp and the bottom surface of the wafer holding platform 54. The shafts 55 and 56 are fastened respectively to the clamps 52 and 53, and these shafts run perpendicular to the plane of the motion of the wafer holding platform 54.

Figure 3B:
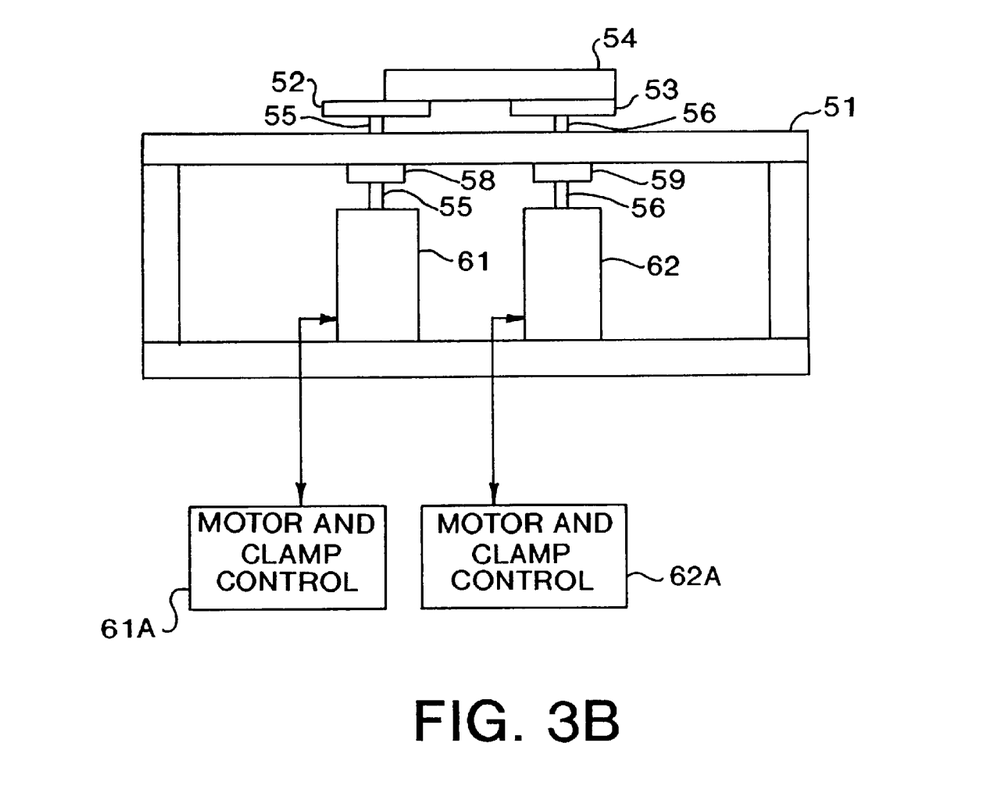
FIG. 3B shows a side view of an example of a wafer positioning system according to the present invention.
Figure 7:
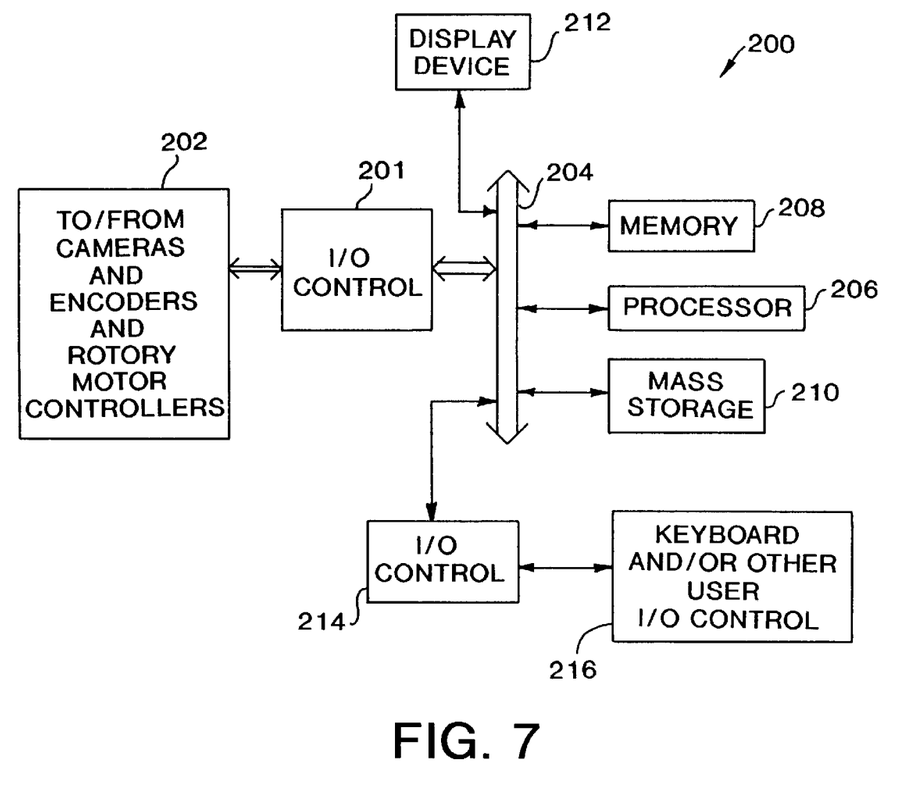
FIG. 7 shows an example of a computer system which may be used to control a wafer positioning system of the present invention.

FIG. 3B shows a side view of the wafer positioning system 50. The shafts 55 and 56 are inserted through holes in the top platform of structure 51. Angle encoders 58 and 59 are fastened respectively to shafts 55 and 56. These angle encoders provide angle position information to a control system, such as a computer system or other digital processing system; FIG. 7 shows an example of such a control system implemented as a computer system. The motor 61 provides rotational force to the shaft 55 which in turn rotates the clamp 52. Similarly, the rotary motor 62 provides a rotational force through the shaft 56 to the clamp 53 in order to turn the clamp 53. Motor and clamp control 61a controls the motor 61 and the clamp 52. Similarly, the motor and clamp control 62a controls the motor 62 and the clamp 53. It will be appreciated that these controls may be integrated together such that one control unit controls both motors and both clamps. It will be appreciated that the wafer holding platform 54 may include other features in addition to vacuum rings; for example, the wafer holding platform 54 may include a camera for viewing pins on probe cards.

Figure 3C:
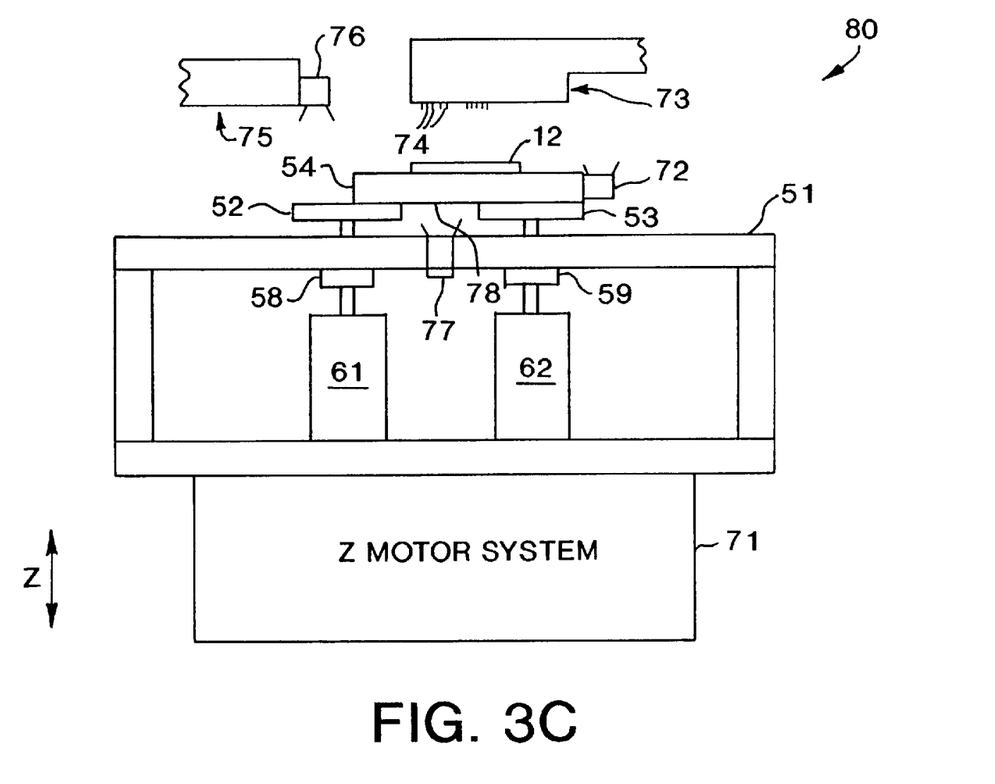
FIG. 3C shows an example of the use of the wafer positioning system according to the present invention in an example of a wafer prober.

FIG. 3C shows an example of the use of a wafer positioning system according to the present invention in a wafer prober 80. The wafer prober 80 includes a Z motor system 71 which moves the entire structure 51 with the wafer holding platform 54 up and down in the Z direction. This Z motor system 71 is mounted below the bottom of the structure as shown in FIG. 3C. An edge of the wafer chuck 54 includes a camera 72 which may be used to view the probing pins 74 on the probe card 73. The wafer prober 80 also includes a camera 76 mounted on a bracket 75; the camera 76 may be used to view a wafer on the wafer holding platform 54, such as the wafer 12 as shown in FIG. 3C. Accurate positioning of the wafer 12 relative to the probe pins 74 may be achieved using a camera 77 mounted on the structure 51. Camera 77 views a two dimensional position encoder 78 fastened to the bottom of the wafer chuck 54. Wafer features, such as die bonding pads, are accurately located relative to encoder 78 by viewing the wafer features with camera 76 and simultaneously viewing encoder 78 with camera 77. The location of the probe pins 74 relative to the camera 77 may be determined by viewing the probe pins 74 with camera 72 and viewing the encoder 78 with camera 77. Referring to the example shown in FIG. 7, processor 206 then computes the optimal position of the wafer chuck required to align pins 74 with die bond pads on wafer 12. Because the displacement of the optical axis of camera 77 from the probe pins 74 can be kept small in this configuration, Abbe offset errors may be kept small. Other features included in the wafer prober system 80 may include heating subsystems for heating the wafer holding platform in order to test the IC on the wafer at high temperatures, a lighting system to supply light for the cameras 72 and 76 so that the cameras may view the wafer or the probe card with adequate lighting, inkers for inking IC's, etc. The operation of the wafer prober system 80 is similar to conventional wafer prober systems except that the wafer holding platform 54 is translated in the plane defined by the surfaces of the clamps 52 and 53 by rotating the wafer holding platform 54 rather than by rectilinearly moving the wafer holding platform as in conventional wafer probers. Thus, an IC on the wafer 12 is positioned below the appropriate probing pins 74 on the probe card 73 by rotating appropriately the wafer holding platform 54 so that the pins 74 are directly above the appropriate bonding pads on the IC. After accomplishing this movement in the X,Y plane, the Z motor system 71 is used to raise the wafer 12 so that the appropriate bonding pads on the IC on the wafer 12 are made to electrically contact the appropriate probe pins 74. It will be appreciated that an alternative wafer prober may have a Z stage which is above the clamps 52 and 53 and below the top surface of the wafer holding platform and which moves that top surface up and down in Z relative to the clamps.

Figure 4:
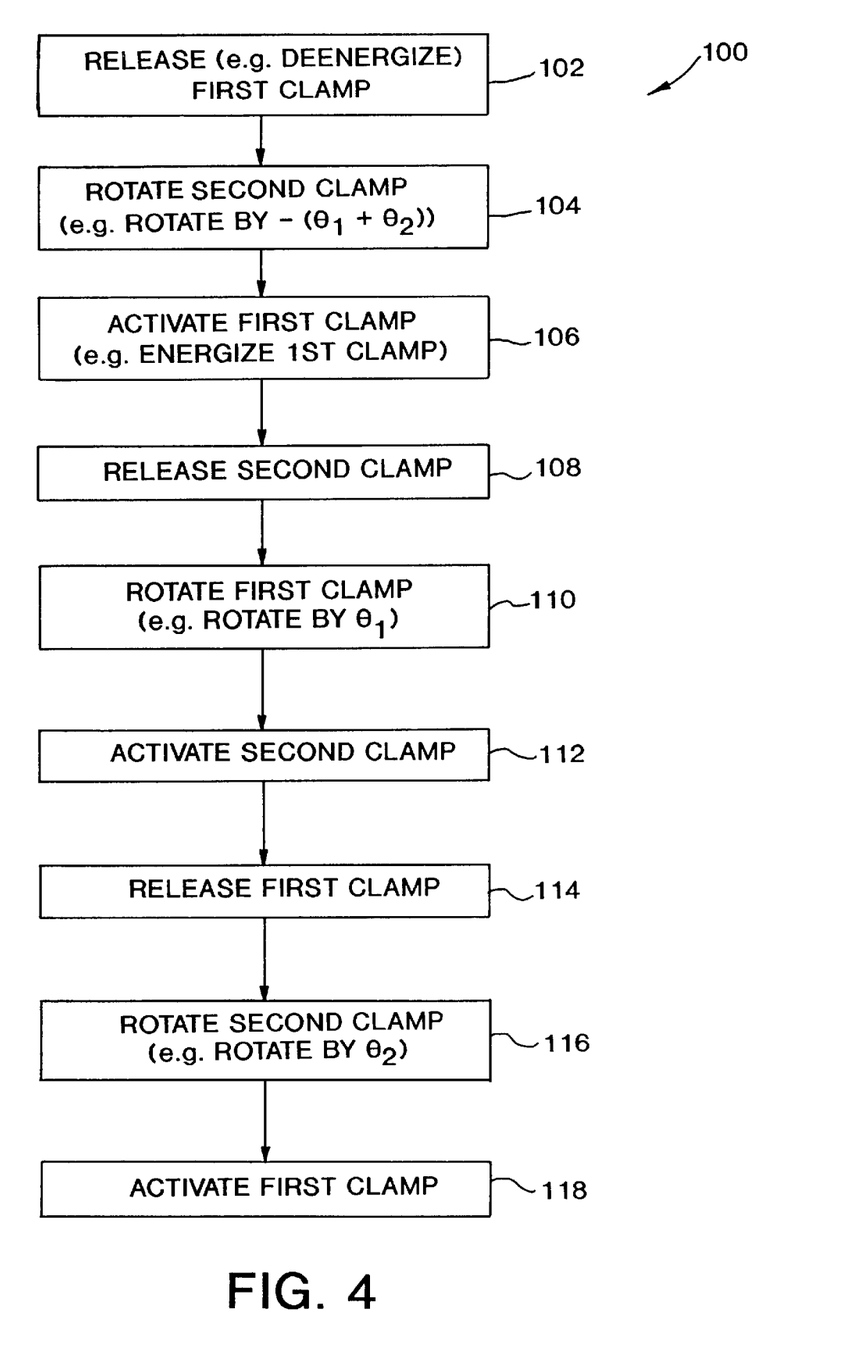
FIG. 4 is a flowchart which illustrates various steps according to one embodiment of a method of the present invention.

FIG. 4 is a flowchart which illustrates one example of a method according to the present invention in which the wafer holding platform is moved in the X,Y plane by a sequence of three alternating rotations of the two clamps. This particular example achieves a translation of a point on the wafer holding platform without also producing a resultant rotation of the wafer holding platform. This is often important in the case of a wafer prober because the pins on a probe card are typically arranged in a rectangular fashion, and these pins cannot be normally rotated. Thus, it is important to move a wafer in only X and Y without any rotation of the wafer in order to assure that the proper probe pins will contact the proper bonding pads on the IC to be tested.

FIG. 4 shows a method 100 for practicing one example of the present invention. The method begins in step 102 in which the first clamp is released; this may occur by deenergizing the electromagnets in the first clamp. Then in step 104, the second clamp is rotated (it is assumed that the second clamp has been activated to grasp the wafer holding platform to rotate it). The amount of rotation will be determined by the amount of X,Y movement which is required between the original position and the final position. This is described further below in detail. In one embodiment, the rotation is by an amount equal to $-(\theta_1 + \theta_2)$. In step 106, the first clamp is activated after having rotated the second clamp in step 104. The activation may occur by energizing the electromagnets in the first clamp. Then in step 108, the second clamp is released, and in step 110, the first clamp is rotated while keeping the second clamp released. The amount of rotation of the first clamp in step 110 depends upon the desired X,Y translation; in one embodiment, the rotation in step 110 is by an amount equal to $\theta_1$. After the rotation in step 110, the second clamp is again activated in step 112. It will be appreciated that each time a rotation occurs, such as in step 104, the appropriate clamp which is performing the rotation is activated at the time of the rotation in order to grasp the wafer holding platform to rotate it. In step 114, the first clamp is released, and then in step 116, the second clamp is again rotated. The amount of rotation in one example of the second clamp in step 116 is $\theta_2$. Finally, in step 118, the first clamp is activated such that the wafer holding platform is held by both the first clamp and the second clamp. At this point in time, wafer probing may occur by moving the probe card or by moving the wafer holding platform such that bonding pads on at least one integrated circuit on the wafer are brought into electrical contact with probing pins or other connecting electrodes on the probe card or other supporting structure for the pins or electrodes.

Figure 5A:
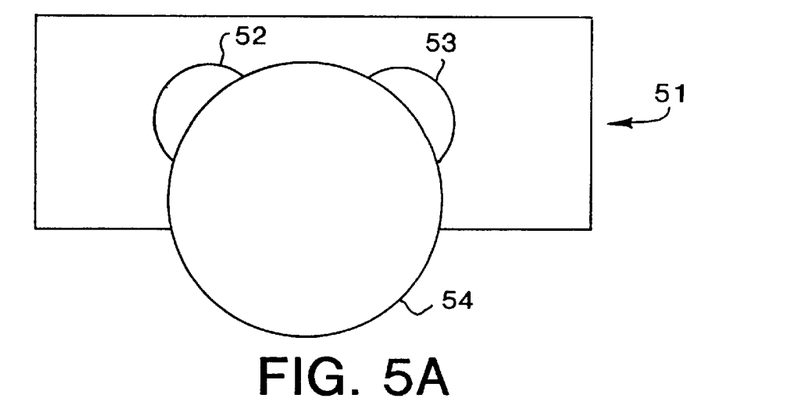
FIGS. 5A, 5B, 5C, and 5D show a top view of a wafer positioning system of the present invention after various rotational movements have occurred.
Figure 5B:
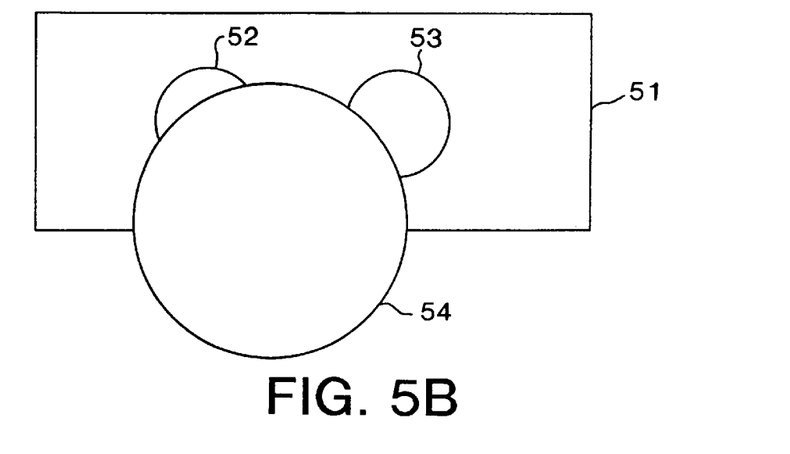
Figure 5C:
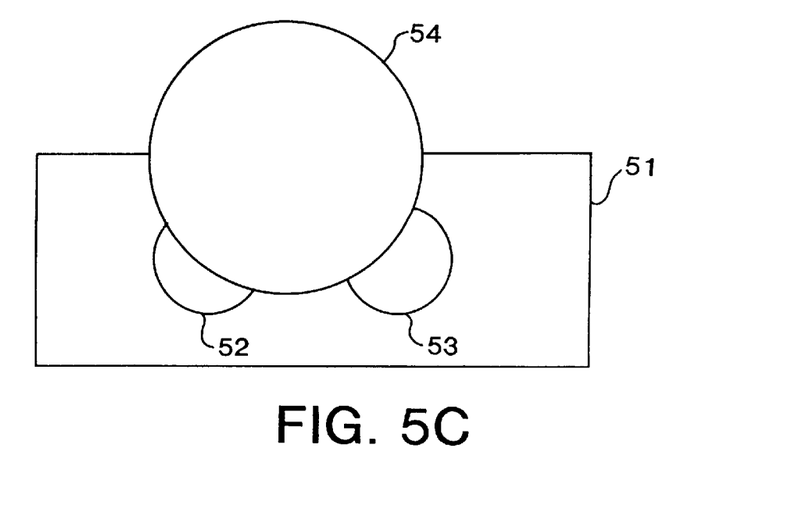
Figure 5D:
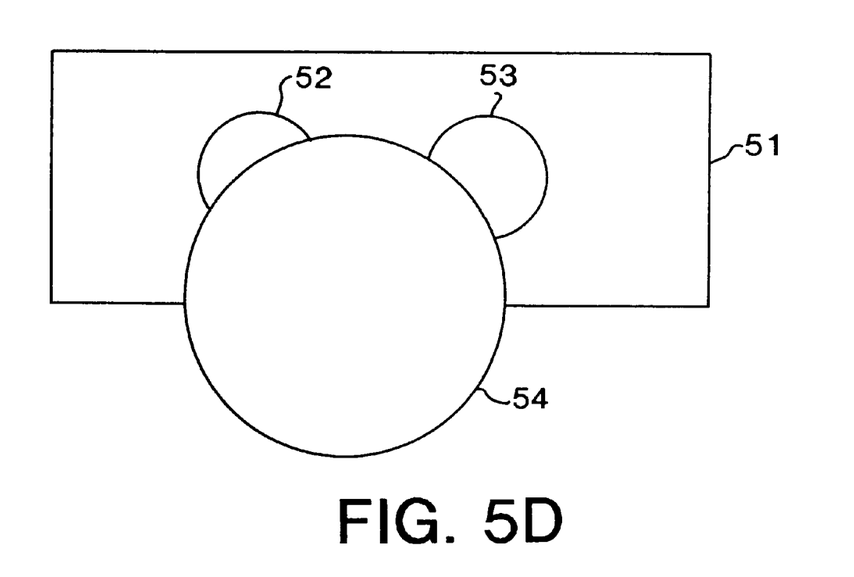

FIGS. 5A, 5B, 5C, and 5D show a top view of four positions of the wafer holding platform 54 relative to the two clamps 52 and 53. FIG. 5A in particular shows an original position for the wafer holding platform 54 before the rotation in step 104 of FIG. 4. FIG. 5B illustrates the position of the wafer holding platform 54 after the clamp 53 has been released in step 102 and after the clamp 52 has been rotated in step 104. FIG. 5C shows a top view of the wafer holding platform 54 after steps 108 and 110 in which clamp 52 was released in step 108 and clamp 53 was rotated in step 110. FIG. 5D shows the resulting position of the wafer holding platform 54 after steps 114 and 116 in which clamp 53 was released in step 114 and clamp 52 was rotated in step 116. The rotations may be performed with the servo motors 61 and 62 which are connected to the shafts and to the clamps 52 and 53 respectively. Each shaft is equipped with an angle encoder for the purpose of feedback control of the clamp location such that the angular location of each clamp is known by the control system (e.g. see FIG. 7) as the clamp is rotated. Rotary servo technology is a well known art.

Figure 6:
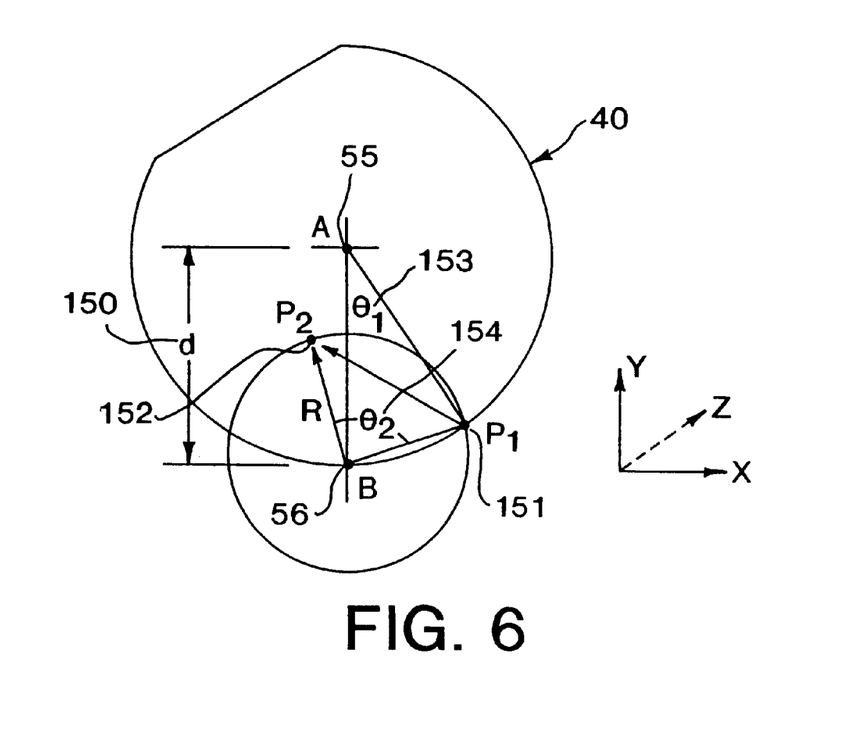
FIG. 6 shows a geometric construction of a translation from a series of rotations which is employed in one example of the present invention.

The following section of this description provides a theoretical analysis which shows how to determine the amount of the various rotations in order to achieve a movement in the X,Y plane without also achieving a resultant rotation of the wafer. The following discussion will refer to FIG. 6 in which the perimeter of the wafer 40 is shown superimposed over the shaft 55 which defines one axis of rotation for the clamp 52. The end of the shaft 56 is also shown at point B, while the end of the shaft 55 is shown at point A. The rotations performed by the clamps cause a rotation in the X,Y plane and the axes of rotation are parallel to the Z axis as shown in FIG. 6. In the following description, a general translation or movement by X in the X direction and by Y in the Y direction will be described. "A" of FIG. 6 will be treated as an axis of rotation located at the X,Y position of (0,d/2), and "B" of FIG. 6 will be considered a second axis of rotation located at (0,−d/2). FIG. 6 shows a geometric construction by which a point on the axis B is moved to a point $P_2$ (point 152 shown in FIG. 6).

The first step is to rotate the clamp 52 around the axis A (defined by shaft 55) by an amount $\theta_1$ shown as angle 153 such that the point B is moved to point $P_1$ (point 151). Note that the movement of the point B on wafer 40 from its original location to point $P_1$ is such that $P_1$ and $P_2$ are equidistant from the axis of rotation B. It is clear from FIG. 6 that this is possible if $P_2$ is closer to the axis of rotation B than the distance 2d. As shown in FIG. 6, the distance between the axis of rotation A and the axis of rotation B is shown as the distance d which is labeled with the reference numeral 150. Next the point $P_1$ is moved to point $P_2$ by a rotation by the angle $\theta_2$ (shown as reference angle 154) about the axis B. Note that while we have moved point B to $P_2$, we have also rotated the entire wafer 40 by a net angle of $\theta_{1+\theta 2}$.

To achieve a pure translation in X,Y without a resultant rotation of the wafer 40, an initial rotation by an amount of $-\theta_1-\theta_2$ may be performed about the B axis before the two rotations by $\theta_1$ around axis A and by $\theta_2$ around axis B. Since a point at B on the wafer 40 is not moved by this initial rotation, the point at B will again arrive at $P_2$; however, at this time, no net rotation will have taken place after all three rotations. Since the net rotation angle is 0 after these three rotations, the motion performed by these three rotations is a pure translation in X,Y. This fact may be verified by the following computational analysis.

A rotation about the A axis is written $$R_A(\theta)\binom{x}{y} = \begin{bmatrix} \cos(\theta) & -\sin(\theta) \\ \sin(\theta) & \cos(\theta) \end{bmatrix}\binom{x}{y-d/2} + \binom{0}{d/2} \quad (1)$$

with the corresponding rotation, $R_B$, about the B axis obtained by substitution of $-d$ for $d$ in the above expression. The translation given above may be written in terms of these rotations as $$\binom{x'}{y'} = T(\theta_1, \theta_2)\binom{x}{y} = R_B(\theta_2)R_A(\theta_1)R_B(-\theta_1-\theta_2)\binom{x}{y} \quad (2)$$

where (x', y') is the final resting place of the point (x,y). Expanding above expression out yields $$x^1 = x + (\sin(\theta_1+\theta_2)-\sin(\theta_2))d$$
$$y^1 = y - (\cos(\theta_1+\theta_2)-\cos(\theta_2))d \quad (3)$$

which is seen to be a translation of every point in the plane as expected.

While the Equation 3 is important, the inverse problem of determining the rotation angles given the desired translation is now addressed. Algebra reveals that $$\cos(\theta_1) = \frac{2d^2 - R^2}{2d^2} \quad (4)$$

where d is the distance between A and B and R is the length of the translation. From Equation 4 the sense (sign) of the rotation angle, $\theta_1$, may be either clockwise (negative) or counter clockwise (positive) about the A axis. To arrive at the point $P_2$ a rotation by $\theta_2$ is performed around B. Further algebra yields the expressions $$\cos(\theta_2^+) = \frac{x\sqrt{4d^2 - R^2} + yR}{2dR} \quad (5)$$

$$\sin(\theta_2^+) = \frac{y\sqrt{4d^2 - R^2} - xR}{2dR}$$

for a counter clockwise $\theta_1$ and for a clockwise $\theta_1$ we obtain $$\cos(\theta_2^-) = \frac{-x\sqrt{4d^2 - R^2} + yR}{2dR} \quad (6)$$

$$\sin(\theta_2^-) = \frac{-y\sqrt{4d^2 - R^2} - xR}{2dR}$$

Examination of Equations 4, 5, and 6 shows that the translations with three rotations are restricted to lie within a circle of radius 2d which is consistent with the description above. To permit motion anywhere within a 300 mm diameter disk (e.g. a 12 inch wafer) with just three rotations requires that the separation between the axes be chosen to be equal or greater than 150 mm. Smaller separations between A and B are possible, however, more than three rotations would be required for some moves.

FIG. 7 shows a digital processing system which may be a conventional general purpose computer system. This system 200 may be used to control the wafer positioning system 50 by receiving inputs from the cameras (which form a portion of the vision system) and information from the encoders, such as the encoders 58 and 59, and by providing inputs to the rotary motor and clamp controllers, such as the controllers 61*a* and 62*a* shown in FIG. 3B. These inputs and outputs 202 as shown in FIG. 7 are channeled through an input/output controller 201 which provides data to and from the remainder of the processing system 200. Typically, the processor 206 is a general purpose microprocessor which retrieves executable computer program instructions from a mass storage 210 such as a hard disk and which stores values in the memory 208, which may be random access memory. Data is exchanged through this system over at least one bus 204 which interconnects the various components of the system 200. Also as shown in FIG. 7, the system may include a display device 212, such as a conventional CRT monitor, and may further include user I/O control input such as a keyboard which operates under control of a controller 214.

The processor 206 typically performs the computations described above in order to determine the various rotations required for a particular translation. Furthermore, the processor provides the clamp and motor controls to operate in accordance with the methods of the present invention, such as the method shown in FIG. 4. In this manner, an automatic wafer positioning system may be provided relatively inexpensively and yet provide high positioning resolution.

The foregoing description provides examples of the present invention. It will be understood that, upon reference to this disclosure, there are other alternative examples and implementations of the present invention. For example, the clamping and unclamping may be performed by using vacuum. A vacuum pump may be coupled to each clamp, and vacuum may be selectively applied to each clamp. When vacuum is applied to a clamp, it grasps the wafer holding platform and when vacuum is not applied, the wafer holding platform is free to move relative to that clamp. The clamp's surface includes holes for allowing the vacuum to suck the wafer holding platform down against the clamp, and these same holes may be used to pump air to create an air bearing surface above the clamp when the clamp is not grasping the wafer holding platform.

What is claimed is:

1. A method for positioning a wafer holding platform, said method comprising:

coupling a first clamp to said wafer holding platform;

decoupling a second clamp from said wafer holding platform;

rotating said first clamp to cause said wafer holding platform to be moved to a first position.

2. A method as in claim 1 further comprising:

coupling said second clamp to said wafer holding platform while decoupling said first clamp from said wafer holding platform;

rotating said second clamp to cause said wafer holding platform to be moved to a second position.

3. A method as in claim 2 further comprising:

coupling again said first clamp to said wafer holding platform while decoupling again said second clamp from said wafer holding platform;

rotating again said first clamp to cause said wafer holding platform to be moved to a third position.

4. A method as in claim 3 wherein a point on said wafer holding platform is moved from an original position to said first position, to said second position and to said third position such that said point is moved in an X,Y coordinate system without a resultant rotation of said wafer holding platform after said point is moved to said third position.

5. A method as in claim 1 wherein said coupling step occurs by electromagnetically coupling said first clamp to said wafer holding platform.

6. A method as in claim 2 further comprising monitoring the rotational movements to provide feedback of the position of said wafer holding platform.

7. A method as in claim 1 wherein said first clamp and said second clamp are couplable independently to said wafer holding platform.

8. A method as in claim 7 further comprising:

moving in a Z dimension said wafer holding platform relative to probe contacts on a probe platform in order to test an integrated circuit disposed on said wafer holding platform.

9. A wafer positioning system comprising:

a first clamp having a first axis of rotation;

a second clamp having a second axis of rotation, said first axis and said second axis being non-concentric;

a wafer holding platform being independently couplable to said first clamp and said second clamp, said wafer holding platform being positionable at a plurality of X,Y locations by rotating independently said first clamp and said second clamp.

10. A wafer positioning system as in claim 9 further comprising at least one motor coupled to one of said first clamp and said second clamp.

11. A wafer positioning system as in claim 10 wherein said at least one motor is independently couplable to said first clamp and to said second clamp.

12. A wafer positioning system as in claim 9 further comprising:

a first rotary motor coupled to said first clamp;

a second rotary motor coupled to said second clamp.

13. A wafer positioning system as in claim 12 further comprising:

a first angle encoder coupled to said first clamp;

a second angle encoder coupled to said second clamp, said first and said second angle encoders providing rotational position information for positioning each of a plurality of points on said wafer holding platform at said plurality of X,Y locations.

14. A wafer positioning system as in claim 13 wherein said first clamp when coupled to said wafer holding platform is coupled electromagnetically and said second clamp when coupled to said wafer holding platform is coupled electromagnetically.

15. A wafer positioning system as in claim 14 further comprising a Z-motion stage coupled to said wafer holding platform, said Z-motion stage moving said wafer holding platform to a plurality of Z-positions.

16. A wafer positioning system as in claim 15 wherein said first axis and said second axis are separated by a distance which allows positioning of said each of a plurality of points at said plurality of X,Y locations with no more than three separate rotations of said first and said second clamps.

17. A wafer positioning system as in claim 16 wherein said system allows rectilinear translation of said each of a plurality of points to said plurality of X, Y locations without a resultant rotation of said wafer holding platform after a rectilinear translation.

18. A wafer positioning system as in claim 9 further comprising:

a position encoder coupled to said wafer holding platform, and a first camera which views said position encoder.

19. A wafer positioning system as in claim 18 wherein said first camera views said position encoder and a second camera views a wafer disposed on said wafer holding platform in order to locate a feature on said wafer relative to said position encoder.

20. A wafer positioning system as in claim 19 wherein a third camera views at least one electrode on an electrode support and said first camera views said position encoder in order to locate said at least one electrode relative to said first camera.

21. A computer readable storage medium containing a plurality of computer program instructions which, when executed in a digital processing system cause said digital processing system to control a wafer positioning system by performing a method comprising:

coupling a first clamp to a wafer holding platform;

decoupling a second clamp from said wafer holding platform;

rotating said first clamp to cause said wafer holding platform to be moved to a first position.

22. A computer readable storage medium as in claim 21 wherein said method further comprises:

coupling said second clamp to said wafer holding platform while decoupling said first clamp from said wafer holding platform;

rotating said second clamp to cause said wafer holding platform to be moved to a second position.

23. A computer readable storage medium as in claim 22 wherein said method further comprises:

coupling again said first clamp to said wafer holding platform while decoupling again said second clamp from said wafer holding platform;

rotating again said first clamp to cause said wafer holding platform to be moved to a third position, wherein a point on said wafer holding platform is moved from an original position to said first position, to said second position and then to said third position such that said point is moved rectilinearly in an X,Y coordinate system without a resultant rotation of said wafer holding platform after said point is moved to said third position.

24. A wafer prober system comprising:

a wafer positioning system, wherein said wafer positioning system further comprises a first clamp having a first axis of rotation, and a second clamp having a second axis of rotation, said first axis and said second axis being non-concentric, a wafer holding platform being independently couplable to said first clamp and said second clamp, said wafer holding platform being positionable at a plurality of X, Y locations by rotating independently said first clamp and said second clamp, and wherein said first clamp when coupled to said wafer holding platform is coupled electromagnetically and said second clamp when coupled to said wafer holding platform is coupled electromagnetically, a first rotary motor coupled to said first clamp, a second rotary motor coupled to said second clamp, a first angle encoder coupled to said first clamp, and a second angle encoder coupled to said second clamp wherein said first and said second angle encoders provide rotational position information for positioning each of a plurality of points on said wafer holding platform at said plurality of X, Y locations;

a Z-motion stage coupled to said wafer holding platform, said Z-motion stage moving said wafer holding platform to a plurality of Z-positions;

a first camera for viewing a wafer on said wafer holding platform;

a second camera for viewing a probe card;

a lighting system for providing light for the viewing operation of said first and said second cameras; and a processor coupled to said first camera and said second camera and to said first angle encoder and to said second angle encoder, said processor controlling rotation of said first and said second clamps to position said wafer holding platform at said plurality of X, Y locations.

25. A method for positioning a platform, said method comprising:

coupling a first clamp to said platform;

decoupling a second clamp from said platform;

rotating said first clamp to cause said platform to be moved to a first position.

26. A method as in claim 25 further comprising:

coupling said second clamp to said platform while decoupling said first clamp from said platform;

rotating said second clamp to cause said platform to be moved to a second position.

27. A method as in claim 26 further comprising:

coupling again said first clamp to said platform while decoupling again said second clamp from said platform;

rotating again said first clamp to cause said platform to be moved to a third position.

28. A method as in claim 27 wherein a point on said platform is moved from an original position to said first position, to said second position and to said third position such that said point is moved in an X,Y coordinate system without a resultant rotation of said platform after said point is moved to said third position.

29. A method as in claim 26 further comprising monitoring the rotational movements to provide feedback of the position of said platform.

30. A method as in claim 25 wherein said coupling step occurs by electromagnetically coupling said first clamp to said platform.

31. A method as in claim 25 wherein said first clamp and said second clamp are couplable independently to said platform.

32. A method as in claim 31 further comprising:

moving in a Z dimension said platform relative to probe contacts on a probe platform in order to test an integrated circuit disposed on said platform.

33. A positioning system comprising:

a first clamp having a first axis of rotation;

a second clamp having a second axis of rotation, said first axis and said second axis being non-concentric;

a platform being independently couplable to said first clamp and said second clamp, said platform being positionable at a plurality of X,Y locations by rotating independently said first clamp and said second clamp.

34. A positioning system as in claim 33 further comprising at least one motor coupled to one of said first clamp and said second clamp.

35. A positioning system as in claim 34 wherein said at least one motor is independently couplable to said first clamp and to said second clamp.

36. A positioning system as in claim 33 further comprising:

a first rotary motor coupled to said first clamp;

a second rotary motor coupled to said second clamp.

37. A positioning system as in claim 36 further comprising:

a first angle encoder coupled to said first clamp;

a second angle encoder coupled to said second clamp, said first and said second angle encoders providing rotational position information for positioning each of a plurality of points on said platform at said plurality of X,Y locations.

38. A positioning system as in claim 37 wherein said first clamp when coupled to said platform is coupled electromagnetically and said second clamp when coupled to said platform is coupled electromagnetically.

39. A positioning system as in claim 38 further comprising a Z-motion stage coupled to said platform, said Z-motion stage moving said platform to a plurality of Z-positions.

40. A positioning system as in claim 39 wherein said first axis and said second axis are separated by a distance which allows positioning of said each of a plurality of points at said plurality of X,Y locations with no more than three separate rotations of said first and said second clamps.

41. A positioning system as in claim 40 wherein said system allows rectilinear translation of said each of a plurality of points to said plurality of X,Y locations without a resultant rotation of said platform after a rectilinear translation.

42. A positioning system as in claim 33 further comprising:

a position encoder coupled to said platform, and a first camera which views said position encoder.

43. A positioning system as in claim 42 wherein said first camera views said position encoder and a second camera views an integrated circuit disposed on said platform in order to locate a feature on said integrated circuit relative to said position encoder.

44. A positioning system as in claim 43 wherein a third camera views at least one electrode on an electrode support and said first camera views said position encoder in order to locate said at least one electrode relative to said first camera.

45. A computer readable storage medium containing a plurality of computer program instructions which, when executed in a digital processing system cause said digital processing system to control a positioning system by performing a method comprising:

coupling a first clamp to a platform;

decoupling a second clamp from said platform;

rotating said first clamp to cause said platform to be moved to a first position.

46. A computer readable storage medium as in claim 45 wherein said method further comprises:

coupling said second clamp to said platform while decoupling said first clamp from said platform;

rotating said second clamp to cause said platform to be moved to a second position.

47. A computer readable storage medium as in claim 46 wherein said method further comprises:

coupling again said first clamp to said platform while decoupling again said second clamp from said platform;

rotating again said first clamp to cause said platform to be moved to a third position, wherein a point on said platform is moved from an original position to said first position, to said second position and then to said third position such that said point is moved rectilinearly in an X,Y coordinate system without a resultant rotation of said platform after said point is moved to said third position.

48. An integrated circuit prober system comprising:

a positioning system, wherein said positioning system further comprises a first clamp having a first axis of rotation, and a second clamp having a second axis of rotation, said first axis and said second axis being non-concentric, a platform being independently couplable to said first clamp and said second clamp, said platform being positionable at a plurality of X, Y locations by rotating independently said first clamp and said second clamp, and wherein said first clamp when coupled to said platform is coupled electromagnetically and said second clamp when coupled to said platform is coupled electromagnetically, a first rotary motor coupled to said first clamp, a second rotary motor coupled to said second clamp, a first angle encoder coupled to said first clamp, and a second angle encoder coupled to said second clamp, wherein said first and said second angle encoders provide rotational position information for positioning each of a plurality of points on said platform at said plurality of X, Y locations;

a Z-motion stage coupled to said platform, said Z-motion stage moving said platform to a plurality of Z-positions;

a first camera for viewing an integrated circuit on said platform;

a second camera for viewing a probe card;

a lighting system for providing light for the viewing operation of said first and said second cameras; and a processor coupled to said first camera and said second camera and to said first angle encoder and to said second angle encoder, said processor controlling rotation of said first and said second clamps to position said platform at said plurality of X, Y locations.

* * * * *